United States Patent [19]

Dubil et al.

[11] 4,161,706

[45] Jul. 17, 1979

[54] UNIVERSAL TRANSVERSAL FILTER CHIP

[75] Inventors: James F. Dubil, Warrenton, Va.; Alain M. Falcoz, St-Jeannet; Rene J. Glaise, St. Paul de Vence; Christian A. Jacquart, Gattiere, all of France; Howard N. Leighton, Rockville, Md.; Vladimir Riso, Nice, France; Raymond J. Wilfinger, LaGrangeville, N.Y.

[73] Assignee: International Business Machines Corporation, Armonk, N.Y.

[21] Appl. No.: 869,069

[22] Filed: Jan. 12, 1978

[51] Int. Cl.² .................. H03H 9/28; H03H 7/30; G11C 19/28; H03K 5/156
[52] U.S. Cl. .................... 333/165; 328/167; 333/166; 364/862
[58] Field of Search ............ 333/70 T, 70 R, 29, 333/28 R; 307/221 R, 221 C, 221 D; 328/60, 61, 167; 364/741, 724, 824, 827, 825, 862; 357/24

[56] References Cited

U.S. PATENT DOCUMENTS 3,292,110  12/1966  Becker et al. .................. 333/70 T
3,500,215  3/1970  Leuthold et al. ............... 307/221 R Primary Examiner—Alfred E. Smith
Assistant Examiner—Marvin Nussbaum
Attorney, Agent, or Firm—James E. Murray

[57] ABSTRACT

This specification describes a charge-transfer device transversal filter chip in which an input signal is fed in parallel into a number of channels the outputs of which are summed together to provide the desired transversal filter transfer function. Each channel contains an analog shift register, a signal splitter and a polarity selector. The shift registers are of unequal length to provide a different delay thru each channel. The signal splitter provides a plurality of signal paths thru each channel while the polarity selector determines whether a given path in a given channel is added or subtracted in the summation to determine the gain of the given channel in the summation.

5 Claims, 4 Drawing Figures

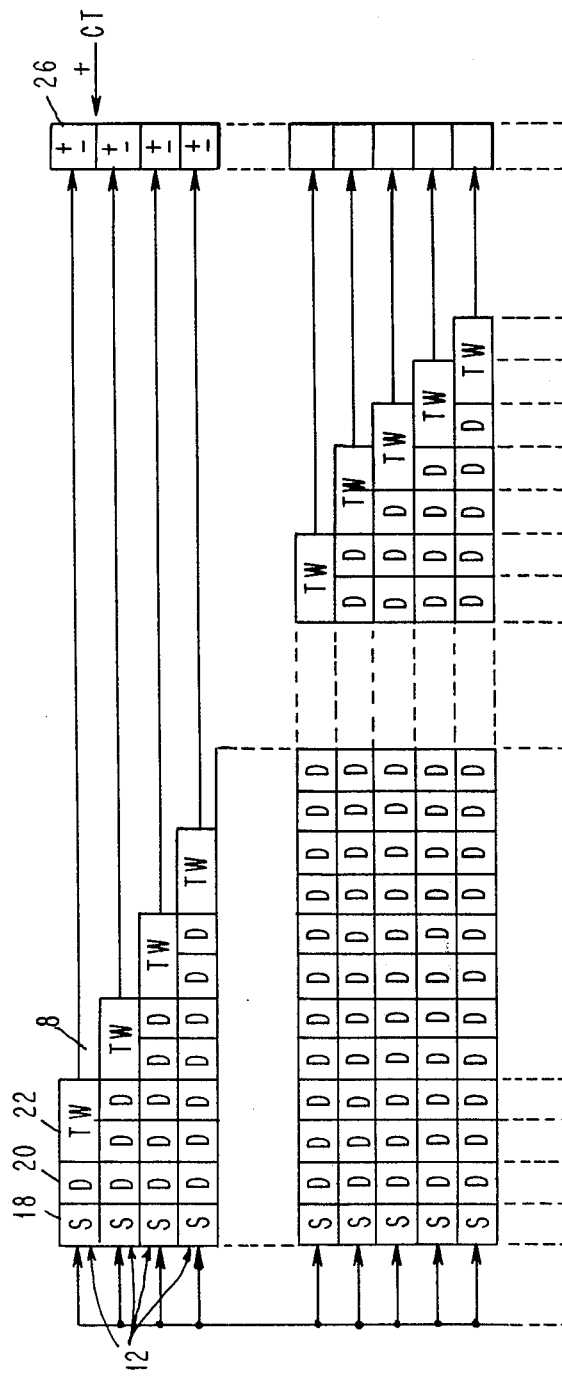
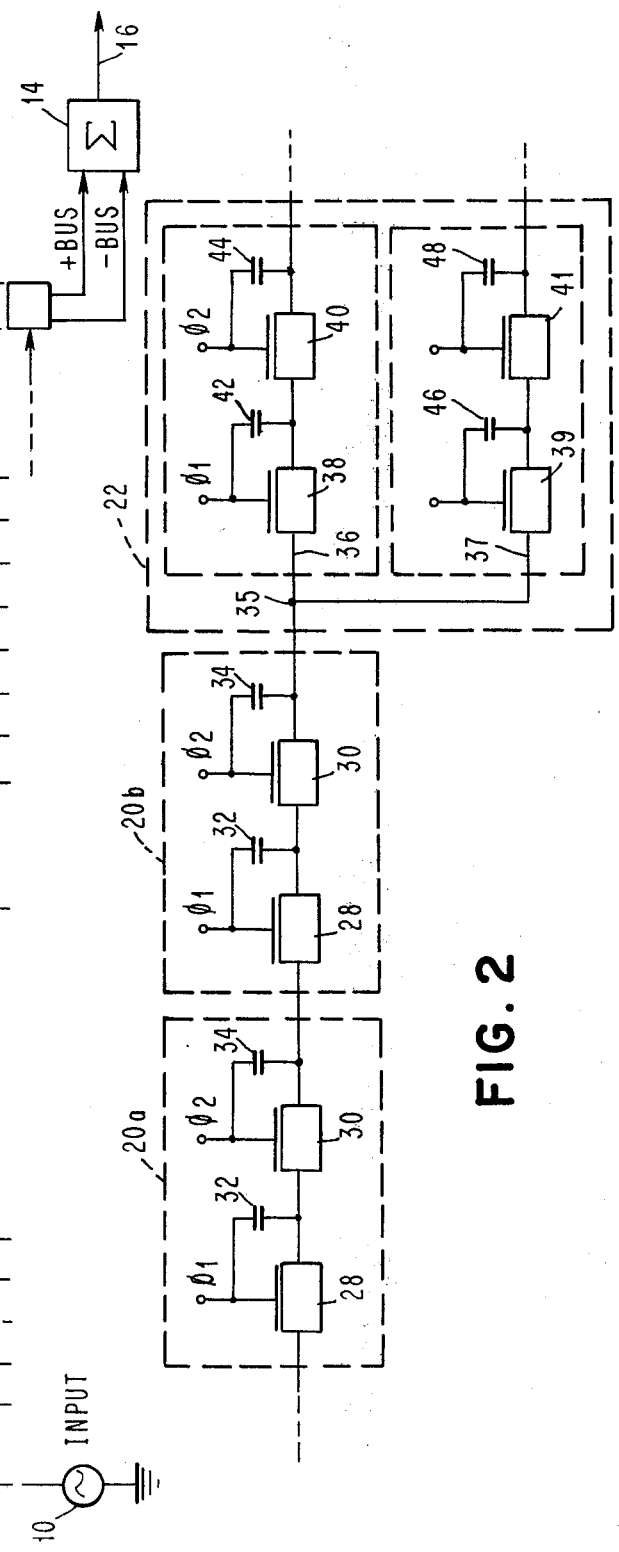

| A | B | C | TW |
|---|---|---|------|
| 0 | 0 | 0 | $-4/4$ |
| 0 | 0 | 1 | $-3/4$ |
| 0 | 1 | 0 | $-2/4$ |
| 0 | 1 | 1 | $-1/4$ |
| 1 | 0 | 0 | 0 |
| 1 | 0 | 1 | $+1/4$ |
| 1 | 1 | 0 | $+2/4$ |
| 1 | 1 | 1 | $+3/4$ |

UNIVERSAL TRANSVERSAL FILTER CHIP

BACKGROUND OF THE INVENTION

The present invention relates to transversal filters and more particularly to a universal transversal filter.

The transversal filter or finite impulse response (FIR) filter, is a device which can be designed with arbitrary impulse response of finite duration to implement a wide range of linear filters. The classical transversal filter consists of a delay line which is tapped at a number of points along its length. The taps are all connected through separate gain setting or selection circuits to a summing network. By properly selecting the gain of each of the gain setting circuits, the desired finite impulse response can be obtained. While such transversal filters are useful, for instance as high pass, low pass or band pass filters, they have the drawback in that any change in function performed by the filter requires a change in the gain setting circuits, thus requiring a different filter design for each new function to be performed. If the transversal filter is to be mounted on a monolithic chip, this would mean that it would be necessary to inventory a different chip for each of the different functions that are possible. Such a large inventory is impractical.

THE INVENTION

Therefore in accordance with the present invention a universal transversal filter is provided which can be formed on a single monolithic chip and be stored as a single part irrespective of the particular personalization of the finished filter. This new transversal filter has a number of channels the outputs of all of which are summed together to obtain the desired transfer function for the transversal filter. Each channel contains an analog shift register, and a signal splitter. The shift registers are of unequal length so that a signal simultaneously fed into the channels emerges from the outputs of the channels at different times. The signal splitters provide a plurality of paths for the signal through each channel. The gain of any channel is determined by how the paths of the channel are summed in the summation of the outputs of the channel to generate the output signal for the channel.

As shall be seen hereinafter, gain selectability can be obtained with variations in the metalization patterns of the chip or by means of electrically controlled circuits which alter the summing connections. In either case the chips are identical irrespective of function until they are actually personalized with the metalization pattern or with the electrical control input.

Therefore it is an object of the present invention to provide a new transversal filter.

Another object of this invention is to provide a transversal filter which can be easily changed to perform a number of functions.

Other objects of the invention are to provide transversal filters which are simple, small, inexpensive and easy to modify.

THE DRAWINGS

These and other objects, features and advantages of the invention will be apparent from the following detailed description of a preferred embodiment of the invention as illustrated in the accompanying drawings of which:

FIG. 1 is a block diagram showing a transversal filter incorporating the present invention.

FIG. 2 is a bucket brigade embodiment of a divert and divide signal splitter circuit.

EMBODIMENT OF THE INVENTION

Figure 3:
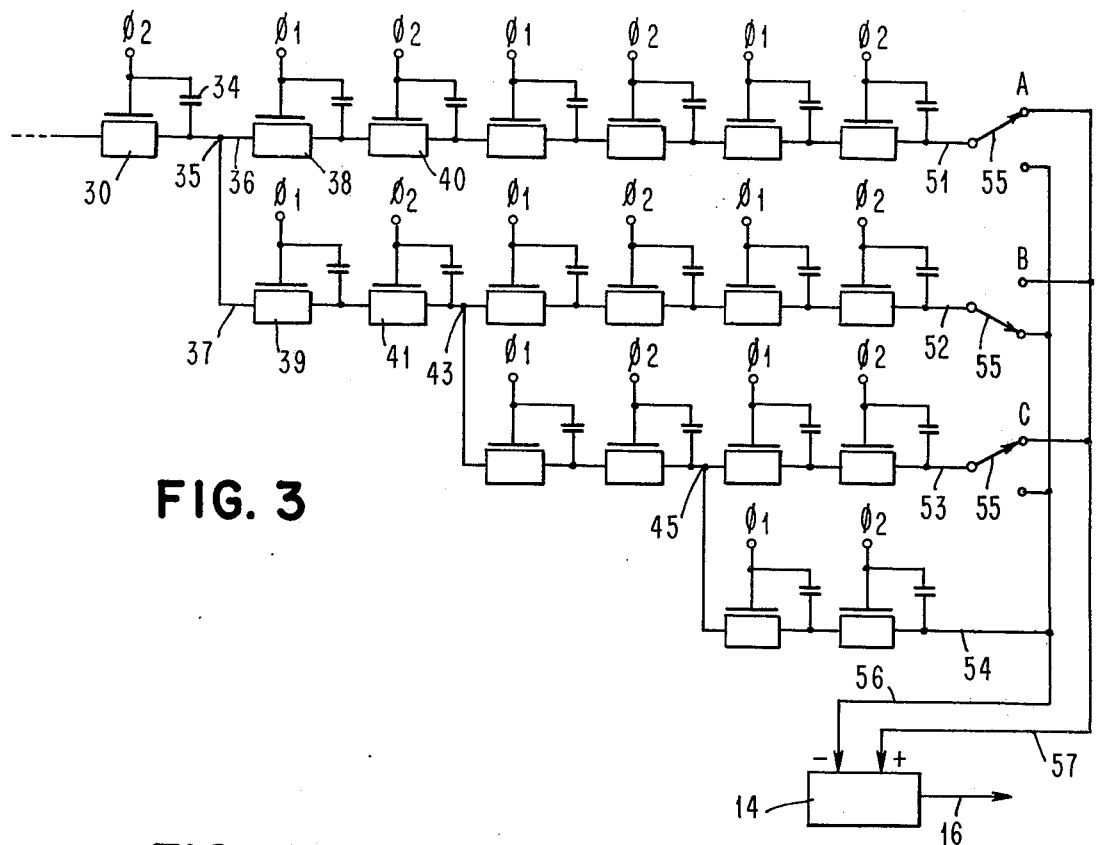
FIG. 3 is a detail of a three-bit divert and divide signal splitter circuit shown in FIG. 1.

Referring to FIG. 1, an input signal 10 is fed in parallel to n delay channels 12. The outputs of these delay channels 12 are summed in a summing network 14 which produces the output signal 16 that is some desired function of the input signal 10. The delay channels 12 each have an input sampling stage 18, one or more analog shift register delay stages 20, a divert and divide network 22 and a gain determining mechanism 26.

As shown in FIG. 2, each shift register delay stage 20 is a charge transfer device circuit which consists of two field effect transistors 28 and 30 with capacitors 32 and 34 connected between their drain and gate. In the example shown in FIG. 1 the first channel would have one such delay stage 20, the second channel would have two such delay stages and the $n^{th}$ channel would have n shift register delay stages 20. Information is transmitted from left to right along these shift registers as charge on the capacitors 32 and 34. The information is transmitted with the use of clock phase pulses $\phi_1$ and $\phi_2$ which are up at mutually exclusive times. With each two clock phase pulses $\phi_1$ and $\phi_2$, the charge on capacitor 32 of one stage 20a is transmitted to the capacitor 32 of the next stage 20b. Such analog charge transfer devices are known as bucket brigade devices and are well known in the prior art.

A rudimentary portion of the divert and divide gain determining network 22 shown in FIG. 2 divides the total charge entering node 35 into two equal parts along paths 36 and 37. If the paths 36 and 37 are truly identical the charge will divide equally so that half of the charge on capacitor 34 in stage 20b will be transfered to capacitor 42 in cell 22 and the other half will be transfered to capacitor 46 in cell 22. Field effect transistors 38 and 39 are placed in close proximity on the chip so that their characteristics match as closely as possible to make paths 36 and 37 nearly identical.

In FIG. 3, the divert and divide network 22 is shown as providing four separate output paths 51 to 54. The first split of the channel 12 into two paths 36 and 37 causes half the charge carried by the channel to emerge from the circuit on output line 51. A second split takes place at node 43, and one-quarter of the total channel signal charge emerges on output line 52. A third division occurs at point 45 so that beyond that point of signal splitting lines 53 and 54 carry one-eighth the charge transmitted through the channel.

The output of each of the lines 51 through 54 is fed into the polarity selection circuit 26. The selection circuit shown in FIG. 3 consists of a metalization pattern on top of a passivation layer covering a silicon chip containing the transversal filter circuit. By this metalization pattern, each of the lines 51 through 54 in all the channels are connected to either a positive or negative bus 56 or 57 which are the inputs to the differential summing network 14.

The gain of any given channel will be determined by the pattern of the connections 55 between the lines 51 through 54 and the busses 56 and 57. If all the elective lines 51 through 53 are connected to the negative bus 56 by the connections 55, the gain of the circuit would be −1, while connection of the lines 51 through 53 by the connections 55 would result in a positive gain $+\frac{3}{4}$. With all possible combinations of connections 55, eight different gains are possible, varying from minus unity to $+\frac{3}{4}$ in eight equal increments.

Aside from the three connections 55 that can be made in any channel, all the transversal filter chips are identical. Thus the chips could be produced up to the point of selecting the connection and stockpiled until a particular transfer function is determined at which point the actual pattern of connections could be made. The connection could be made at that time by forming the elective metal pattern by conventional etching. Alternatively all possible connections of the metal pattern could be placed in the chip at the time of its initial manufacture and the unnecessary ones removed at the time the chip is personalized to perform the desired function.

Figure 4:
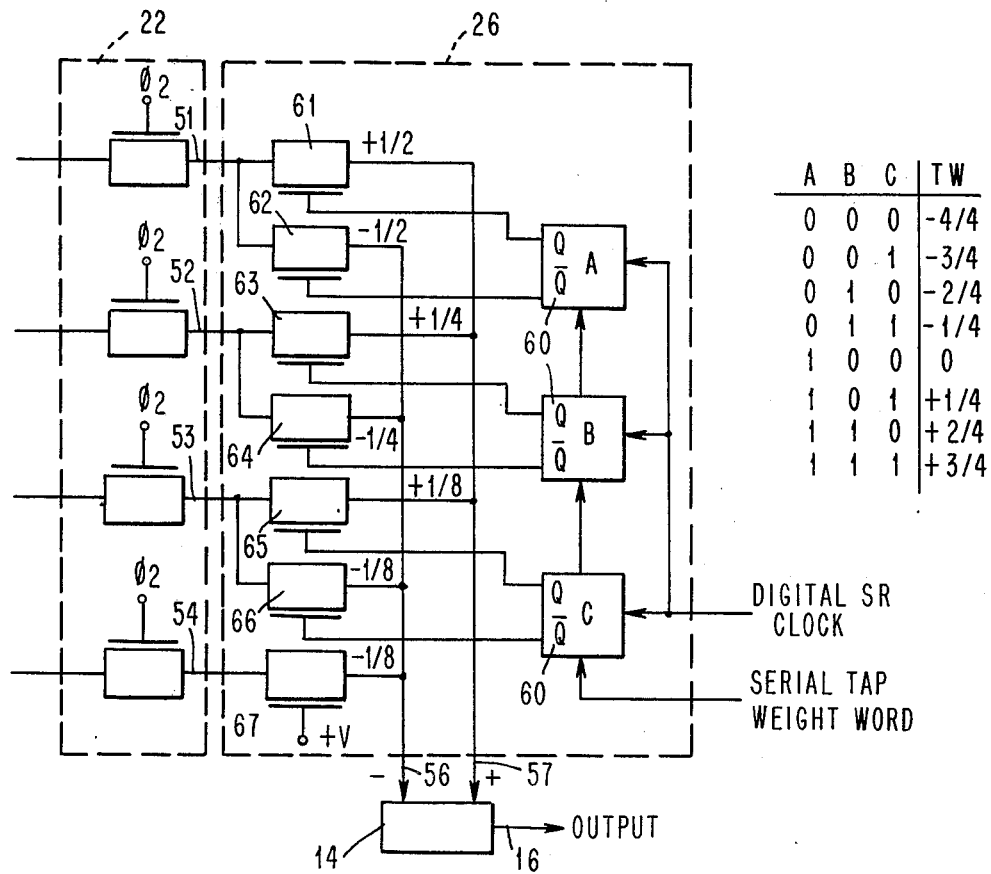
FIG. 4 illustrates an electrically alterable universal transversal filter.

The personalizable metalization pattern is but one approach to changing the function of the transversal filter. A transversal filter with three-bit electrically changeable functions can also be provided as shown in FIG. 4. Here the paths 51 through 54 may be selectively connected by field effect transistor devices 61 through 67 to the positive and negative busses 56 or 57. The gates of each of three pairs of devices are controlled by the outputs of a flip flop 60 so that while one device is conducting the other device will be non-conducting. Each flip flop 60 is a stage of a shift register so that placing digital data serially in the shift register selects the connections between each path and the positive or negative bus. The table shows how the gain of the channel will vary with the information in the shift register stages 60.

While the invention has been particularly shown and described with reference to a preferred embodiment thereof, it will be understood by those skilled in the art that the above and other changes in form and detail may be made therein without departing from the spirit and scope of the invention.

What is claimed is:

1. A transversal filter comprising:
a plurality of channels,
means for feeding a signal into all the channels of the plurality of channels in parallel,
analog shift register delay means in each of the channels for delaying said signal a different amount in each channel, said analog shift register means having at least three parallel shift register segments,
signal splitting means in each channel for placing a portion of said signal on each of the shift register segments to provide each channel with at least three parallel paths, each path carrying a portion of the whole signal transmitted through the channel, and
differential summing means for summing all of the paths in all of the channels together and providing either a positive or negative output signal which is some desired function of the input signal, said summing means having gain setting means in each channel for selecting whether the output of any path in any channel forms a positive or negative increment in the summation to determine the gain of that channel and thereby determine said desired function.

2. The transversal filter of claim 1 wherein said signal splitting means in each channel is a divert and divide device means including a common point at which said signal in said channels is split into two large portions and a different one of said two large portions placed on each of those two paths and a second point located along one of these first two paths from which the third path through each channel branches to split one of said large portions into two smaller portions so that a different one of the smaller portions is placed on each of the third paths and the path along which the second point is located.

3. The transversal filter of claim 2 wherein said at least three segments of each channel appear substantially identical at said points so that one-half the signal is transmitted on each of said first two paths out of said common point and one-quarter of the signal is transmitted out of said second point along said one of said first two paths and the third path.

4. The transversal filter of claim 3 wherein each channel includes a fourth path means which branches from a third point along said third path and contains one-eight the signal transmitted through the channel.

5. The transversal filter of claim 3 wherein said delay means and said signal splitting means are strings of charge transfer devices with a different string on each path in each channel said string being joined at said points.

* * * * *